United States Patent
Chu et al.

(10) Patent No.: US 10,319,795 B2
(45) Date of Patent: Jun. 11, 2019

(54) DISPLAY DEVICE HAVING HIGH RESOLUTION

(71) Applicants: Hsia-Ching Chu, Miao-Li County (TW); Pai-Chiao Cheng, Miao-Li County (TW)

(72) Inventors: Hsia-Ching Chu, Miao-Li County (TW); Pai-Chiao Cheng, Miao-Li County (TW)

( * ) Notice: Subject to any disclaimer, the term of this patent is extended or adjusted under 35 U.S.C. 154(b) by 0 days.

(21) Appl. No.: 15/847,938

(22) Filed: Dec. 20, 2017

(65) Prior Publication Data

US 2018/0233546 A1 Aug. 16, 2018

(30) Foreign Application Priority Data

Feb. 15, 2017 (CN) .......................... 2017 1 0081372

(51) Int. Cl.
*H01L 27/32* (2006.01)
*H01L 51/52* (2006.01)

(52) U.S. Cl.
CPC ...... *H01L 27/3246* (2013.01); *H01L 27/3216* (2013.01); *H01L 27/3276* (2013.01); *H01L 51/5203* (2013.01)

(58) Field of Classification Search
CPC ............. H01L 27/3246; H01L 27/3248; H01L 27/3258; H01L 27/326; H01L 27/3276
See application file for complete search history.

(56) References Cited

U.S. PATENT DOCUMENTS

| 9,543,369 | B2 * | 1/2017 | Lee ..................... H01L 27/3272 |
| 2015/0200237 | A1 | 7/2015 | Yim et al. |
| 2015/0236080 | A1 | 8/2015 | Cho |

* cited by examiner

*Primary Examiner* — Quoc D Hoang
(74) *Attorney, Agent, or Firm* — JCIPRNET

(57) ABSTRACT

The disclosure provides a display device, including a first thin film transistor, an insulating layer disposed on the first thin film transistor, a conductive line, and a pixel define layer. The conductive line is electrically coupled to the first thin film transistor via a first contact hole of the insulating layer. The pixel define layer is disposed on the insulating layer. The pixel define layer has a first opening region, a second opening region, and a third opening region. The first opening region and the second opening region are arranged along the first direction. A distance is the shortest distance between the first contact hole and the first opening region. A second distance is the shortest distance between the first contact hole and the second opening region. The first distance is different from the second distance.

20 Claims, 8 Drawing Sheets

US 10,319,795 B2

DISPLAY DEVICE HAVING HIGH RESOLUTION

CROSS-REFERENCE TO RELATED APPLICATION

This application claims the priority benefit of China application serial no. 201710081372.5, filed on Feb. 15, 2017. The entirety of the above-mentioned patent application is hereby incorporated by reference herein and made a part of this specification.

BACKGROUND OF THE INVENTION

Field of the Disclosure

The disclosure relates to a display device.

Description of Related Art

The display panel in display device has been widely used in a variety of electronic products because of its advantages such as small size and low radiation. As the display technology advances, consumers hold a higher standard for the specification of display panel. Besides wide viewing angle, high contrast, and high color saturation, the consumers also expect to see better resolution. However, there are many types of components disposed in the display panel, which makes it difficult to improve the resolution of the display panel.

SUMMARY OF THE INVENTION

The disclosure is directed to a display device that achieves high resolution.

According to an embodiment of the disclosure, the display device includes a substrate, a first thin film transistor disposed on the substrate, an insulating layer disposed on the first thin film transistor, a conductive line, and a pixel define layer. The conductive line is disposed on the insulating layer and is electrically coupled to the first thin film transistor via a first contact hole of the insulating layer. The conductive line extends along a first direction. The pixel define layer is disposed on the insulating layer. The pixel define layer has a first opening region, a second opening region, and a third opening region. The first opening region and the second opening region are arranged along the first direction. The third opening region is adjacent to the first opening region and the second opening region. The conductive line is located between the first opening region and the third opening region, and the first contact hole is located between the first opening region and the second opening region. The area of the first opening region is less than the area of the third opening region. The area of the second opening region is less than the area of the third opening region. The first contact hole and the first opening region are separated by a first distance. The first contact hole and the second opening region are separated by a second distance. The first distance is different from the second distance.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
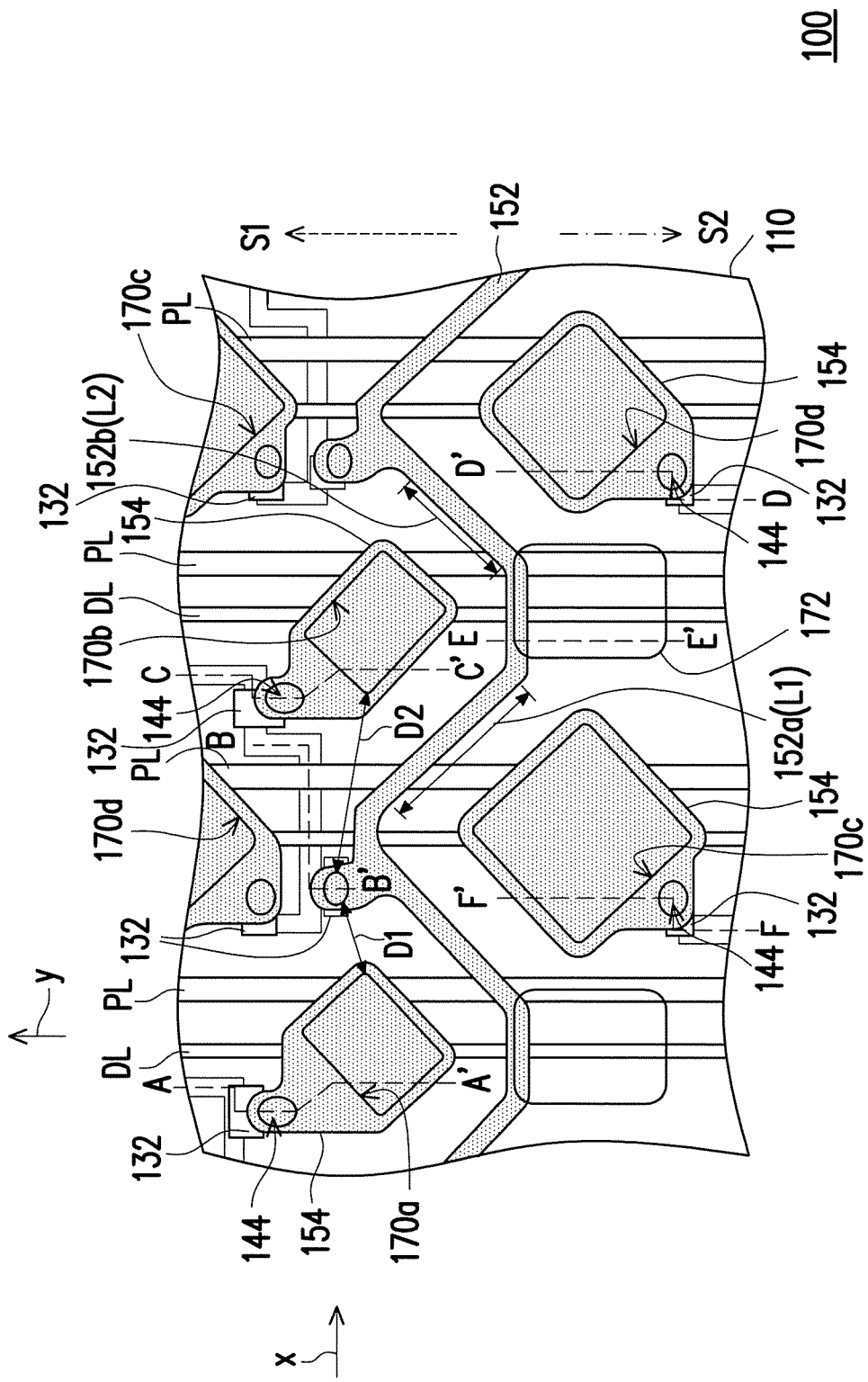
FIG. 1 is a schematic top view of the display device according to an embodiment of the disclosure.

Descriptions of the disclosure are given with reference to the exemplary embodiments illustrated by the figures. Wherever possible, the same reference numerals are used in the figures and the descriptions to refer to the same or similar parts.

A being perpendicular to B indicates that an included angle between A and B ranges from 85°~95°. A being parallel to B indicates that an included angle between A and B ranges from −5°~5°.

Figure 2:
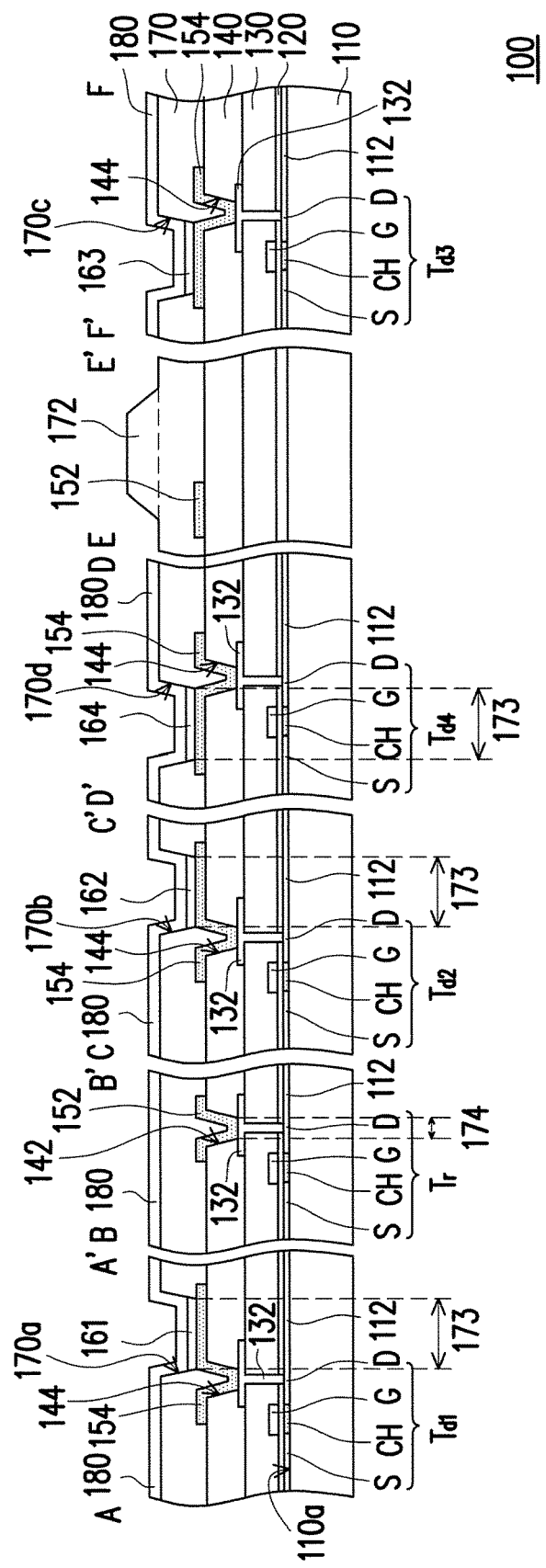
FIG. 2 is a schematic cross-sectional view of the display device according to an embodiment of the disclosure.

FIG. 1 is a schematic top view of a display device according to an embodiment of the disclosure. FIG. 2 is a schematic cross-sectional view of the display device according to an embodiment of the disclosure. In particular, FIG. 2 corresponds to the lines A-A', B-B', C-C', D-D', E-E', and F-F' of FIG. 1. Referring to FIG. 1 and FIG. 2, a display device 100 includes a substrate 110, a first thin film transistor $T_r$, an insulating layer 140, a conductive line 152, and a pixel define layer 170. In this embodiment, the material of the substrate 110 may be glass, quartz, an organic polymer, an opaque/reflective material (e.g., a conductive material, a wafer, ceramics, or other suitable materials), or other suitable materials. The substrate 110 may be a hard substrate, a soft substrate, or a soft and hard composite, but not limited thereto. The display device 100 of the disclosure may also be a flexible display device, a touch display device, or a curved display device, but not limited thereto.

The first thin film transistor $T_r$ is disposed on the substrate 110. In this embodiment, the display device 100 further includes a second thin film transistor $T_{d1}$, a second thin film transistor $T_{d2}$, a second thin film transistor $T_{d3}$, and a second thin film transistor $T_{d4}$ disposed on the substrate 110. The processes for the first thin film transistor $T_r$, the second thin film transistor $T_{d1}$, the second thin film transistor $T_{d2}$, the second thin film transistor $T_{d3}$, and the second thin film transistor $T_{d4}$ are described in detail hereinafter, for example. In this embodiment, a semiconductor pattern (not shown) may be formed on the substrate 110 first; then a portion of the semiconductor pattern is modified (doped, for example), wherein the modified portion of the semiconductor pattern forms a conductive pattern 112, wherein the conductive pattern 112 may include a first end S and a second end D of the first thin film transistor $T_r$, a first end S and a second end D of the second thin film transistor $T_{d1}$, a first end S and a second end D of the second thin film transistor $T_{d2}$, a first end S and a second end D of the second thin film transistor $T_{d3}$, and a first end S and a second end D of the second thin film transistor $T_{d4}$, and another unmodified portion of the semiconductor pattern forms a channel CH of the first thin film transistor $T_r$ and channels CH of the second thin film transistor $T_{d1}$, the second thin film transistor $T_{d2}$, the second thin film transistor $T_{d3}$, and the second thin film transistor $T_{d4}$, wherein the first end S and the second end D of the first thin film transistor $T_r$ are respectively electrically coupled to two sides of the channel CH of the first thin film transistor $T_r$, the first end S and the second end D of the second thin film transistor $T_{d1}$ are respectively electrically coupled to two sides of the channel CH of the second thin film transistor $T_{d1}$, the first end S and the second end D of the second thin film transistor $T_{d2}$ are respectively electrically coupled to two sides of the channel CH of the second thin film transistor $T_{d2}$, the first end S and the second end D of the second thin film transistor $T_{d3}$ are respectively electrically coupled to two sides of the channel CH of the second thin film transistor $T_{d3}$, and the first end S and the second end D of the second thin film transistor $T_{d4}$ are respectively electrically coupled to two sides of the channel CH of the second thin film transistor $T_{d4}$; next, an insulating layer 120 is formed to cover the conductive pattern 112, the channel CH of the first thin film transistor $T_r$, and the channels CH of the second thin film transistor $T_{d1}$, the second thin film transistor $T_{d2}$, the second thin film transistor $T_{d3}$, and the second thin film transistor $T_{d4}$; thereafter, a gate G of the first thin film transistor $T_r$ and gates G of the second thin film transistor $T_{d1}$, the second thin film transistor $T_{d2}$, the second thin film transistor $T_{d3}$, and the second thin film transistor $T_{d4}$ are formed on the insulating layer 120; and then, an insulating layer 130 is formed to cover the gate G of the first thin film transistor $T_r$, the gates G of the second thin film transistor $T_{d1}$, the second thin film transistor $T_{d2}$, the second thin film transistor $T_{d3}$, and the second thin film transistor $T_{d4}$, and a portion of the insulating layer 120. In this embodiment, the first end S may be a source and the second end D may be a drain. Nevertheless, the disclosure is not limited thereto. In other embodiments, the first end S may be a drain and the second end D may be a source. The layer structure described in this embodiment is merely an example. In other embodiments, other layer structures may be disposed therein and are not particularly limited to the above. In this embodiment, the electrical coupling may include cases where two components are electrically connected directly, electrically connected directly via a conductive layer or a semiconductor layer, or connected via other components (e.g., a thin film transistor or a capacitor) therebetween.

In this embodiment, considering conductivity, the gate G, the first end S, and/or the second end D may be formed of a metal material, but the disclosure is not limited thereto. In other embodiments, the gate G, the first end S, and/or the second end D may be formed of other conductive materials, such as an alloy, a nitride of a metal material, an oxide of a metal material, a nitrogen oxide of a metal material, or a stack layer of a metal material and other conductive materials. The material of the insulating layer 120 and/or the insulating layer 130 may be an inorganic material (e.g., silicon oxide, silicon nitride, silicon oxynitride, alumina, or a stack layer of at least two of the foregoing materials), an organic material, or a combination of the foregoing. The material of the channel CH of the first thin film transistor $T_r$ and the channels CH of the second thin film transistor $T_{d1}$, the second thin film transistor $T_{d2}$, the second thin film transistor $T_{d3}$, and the second thin film transistor $T_{d4}$ may be amorphous silicon, polycrystalline silicon, microcrystalline silicon, monocrystalline silicon, an organic semiconductor material, an oxide semiconductor material (e.g., indium zinc oxide, indium germanium zinc oxide, indium tin zinc oxide, other suitable materials, or a combination of the foregoing), other suitable materials, or a combination of the foregoing, but the disclosure is not limited thereto.

It should be noted that the aforementioned processes for the first thin film transistor $T_r$, the second thin film transistor $T_{d1}$, the second thin film transistor $T_{d2}$, the second thin film transistor $T_{d3}$, and the second thin film transistor $T_{d4}$ are examples for explaining the disclosure and should not be construed as a limitation to the disclosure. In other embodiments, the first thin film transistor $T_r$, the second thin film transistor $T_{d1}$, the second thin film transistor $T_{d2}$, the second thin film transistor $T_{d3}$, and the second thin film transistor $T_{d4}$ may be formed by other suitable methods. Moreover, the forms of the first thin film transistor $T_r$, the second thin film transistor $T_{d1}$, the second thin film transistor $T_{d2}$, the second thin film transistor $T_{d3}$, and the second thin film transistor $T_{d4}$ are not limited to the top-gate TFT as shown in FIG. 2. In other embodiments, the first thin film transistor $T_r$, the second thin film transistor $T_{d1}$, the second thin film transistor $T_{d2}$, the second thin film transistor $T_{d3}$, and the second thin film transistor $T_{d4}$ may also be bottom-gate TFT, dual-gate TFT, or other suitable TFTs.

A connection portion 132 is disposed on the insulating layer 130 and is electrically coupled to one of the first end S and the second end D of the first thin film transistor $T_r$, one of the first end S and the second end D of the second thin film transistor $T_{d1}$, one of the first end S and the second end D of the second thin film transistor $T_{d2}$, one of the first end S and the second end D of the second thin film transistor $T_{d3}$, or one of the first end S and the second end D of the second thin film transistor $T_{d4}$ via a through hole of the insulating layer 130. The insulating layer 140 is disposed on the first thin film transistor $T_r$ and has a first contact hole 142. In other words, the insulating layer 140 covers the first thin film transistor $T_r$ and the first contact hole 142 of the insulating layer 140 exposes a portion of the connection portion 132. In this embodiment, the insulating layer 140 is further disposed on the second thin film transistor $T_{d1}$, the second thin film transistor $T_{d2}$, the second thin film transistor $T_{d3}$, and the second thin film transistor $T_{d4}$, and has a plurality of second contact holes 144. The second contact holes 144 respectively expose a portion of a plurality of connection portions 132. In this embodiment, the material of the insulating layer 140 may be an inorganic material (e.g., silicon oxide, silicon nitride, silicon oxynitride, or a stack layer of at least two of the foregoing materials), an organic material, or a combination of the foregoing.

The conductive line 152 is disposed on the insulating layer 140 and is electrically coupled to the first thin film transistor $T_r$ via the first contact hole 142 and the connection portion 132. In this embodiment, a reset voltage ($V_{ref}$) may be inputted to one of the first end S and the second end D of the first thin film transistor $T_r$ via the conductive line 152 (e.g., the second end D of the first thin film transistor $T_r$). In other words, the first thin film transistor $T_r$ may be a reset thin film transistor, but the disclosure is not limited thereto. In this embodiment, considering conductivity, the conductive line 152 may be formed of a metal material, but the disclosure is not limited thereto. In other embodiments, the conductive line 152 may be formed of other conductive materials, such as an alloy, a nitride of a metal material, an oxide of a metal material, a nitrogen oxide of a metal material, or a stack layer of a metal material and other conductive materials.

In this embodiment, the display device 100 further includes a plurality of electrodes 154 disposed on the insulating layer 140. The electrodes 154 are respectively electrically coupled to the second thin film transistor $T_{d1}$, the second thin film transistor $T_{d2}$, the second thin film transistor $T_{d3}$, and the second thin film transistor $T_{d4}$ via the second contact holes 144. That is, the electrodes 154 are respectively electrically coupled to the second thin film transistor $T_{d1}$, the second thin film transistor $T_{d2}$, the second thin film transistor $T_{d3}$, and the second thin film transistor $T_{d4}$ via the second contact holes 144 and the connection portions 132. In this embodiment, the electrodes 154 and the conductive line 152 may be selectively formed in the same layer, but the disclosure is not limited thereto. In other embodiments, the electrodes 154 and the conductive line 152 may be respectively formed in different layers. In this embodiment, the material of the electrode 154 is a reflective conductive material, such as a metal, an alloy, and so on, but the disclosure is not limited thereto. In other embodiments, the material of the electrode 154 may be a translucent conductive material, such as indium tin oxide, indium zinc oxide, aluminum tin oxide, aluminum zinc oxide, indium germanium zinc oxide, other suitable oxides, or a stack layer of at least two of the foregoing. The display device 100 further includes a display medium disposed corresponding to the electrode 154. In this embodiment, the display medium includes an organic electroluminescent pattern 161, an organic electroluminescent pattern 162, an organic electroluminescent pattern 163, and an organic electroluminescent pattern 164, for example, but the disclosure is not limited thereto. In other embodiments, the display medium may be other suitable materials. The organic electroluminescent pattern 161, the organic electroluminescent pattern 162, the organic electroluminescent pattern 163, and the organic electroluminescent pattern 164 are respectively disposed on the electrodes 154 corresponding to the second thin film transistor $T_{d1}$, the second thin film transistor $T_{d2}$, the second thin film transistor $T_{d3}$, and the second thin film transistor $T_{d4}$, and the electrodes 154 may be anodes.

In this embodiment, the display device 100 further includes a power line PL (as shown in FIG. 1) disposed on the substrate 110. The power line PL has a power voltage ($V_{DD}$) and is electrically coupled to one of the first ends S and the second ends D of the second thin film transistor $T_{d1}$, the second thin film transistor $T_{d2}$, the second thin film transistor $T_{d3}$, and the second thin film transistor $T_{d4}$. The electrodes 154 of the organic electroluminescent pattern 161, the organic electroluminescent pattern 162, the organic electroluminescent pattern 163, and the organic electroluminescent pattern 164 may be electrically coupled to the second ends D of the second thin film transistor $T_{d1}$, the second thin film transistor $T_{d2}$, the second thin film transistor $T_{d3}$, and the second thin film transistor $T_{d4}$. In other words, in this embodiment, the second thin film transistor $T_{d1}$, the second thin film transistor $T_{d2}$, the second thin film transistor $T_{d3}$, and the second thin film transistor $T_{d4}$ may be light emitting thin film transistors, but the disclosure is not limited thereto.

The pixel define layer 170 is disposed on the insulating layer 140. The pixel define layer 170 includes a first opening region 170a, a second opening region 170b, and a third opening region 170c. In this embodiment, the pixel define layer 170 further includes a fourth opening region 170d. The first opening region 170a, the second opening region 170b, the third opening region 170c, and the fourth opening region 170d respectively partially expose the electrodes 154 that are electrically coupled to the second thin film transistor $T_{d1}$, the second thin film transistor $T_{d2}$, the second thin film transistor $T_{d3}$, and the second thin film transistor $T_{d4}$. In other words, the electrodes 154 partially overlap the first opening region 170a, the second opening region 170b, the third opening region 170c, and the fourth opening region 170d respectively. The "overlap" described in the disclosure refers to overlap in a direction perpendicular to the substrate 110 (in the top view). The organic electroluminescent pattern 161, the organic electroluminescent pattern 162, the organic electroluminescent pattern 163, and the organic electroluminescent pattern 164 are respectively disposed in the first opening region 170a, the second opening region 170b, the third opening region 170c, and the fourth opening region 170d of the insulating layer 140. The display device 100 further includes a common electrode 180. A potential difference between the common electrode 180 and the electrodes 154 drives the display medium (e.g., the organic electroluminescent pattern 161, the organic electroluminescent pattern 162, the organic electroluminescent pattern 163, and the organic electroluminescent pattern 164) to emit light. The common electrode 180 may have a ground potential, but the disclosure is not limited thereto. In this embodiment, the common electrode 180 may be disposed on the pixel define layer 170, and be disposed in the first opening region 170a, the second opening region 170b, the third opening region 170c, and the fourth opening region 170d to be electrically coupled to the organic electroluminescent pattern 161, the organic electroluminescent pattern 162, the organic electroluminescent pattern 163, and the organic electroluminescent pattern 164, but the disclosure is not limited thereto. In this embodiment, the common electrode 180 may be a translucent conductive material, such as indium tin oxide, indium zinc oxide, aluminum tin oxide, aluminum zinc oxide, indium germanium zinc oxide, other suitable oxides, or a stack layer of at least two of the foregoing. However, the disclosure is not limited thereto. In other embodiments, the common electrode 180 may also be a reflective conductive layer and use other suitable materials.

In this embodiment, the display device 100 further includes a data line DL (as shown in FIG. 1) and a scan line (not shown). The display device 100 may further include a switching thin film transistor (not shown). A gate of the switching thin film transistor is electrically coupled to the scan line. One of a first end and a second end of the switching thin film transistor is electrically coupled to the data line DL. The reset voltage ($V_{ref}$) is inputted to one of the first end S and the second end D of the first thin film transistor $T_r$ (e.g., the second end D of the first thin film transistor $T_r$). A reset signal is inputted to the gate G of the first thin film transistor $T_r$. One of the first end S and the second end D of the first thin film transistor $T_r$ (e.g., the first end S of the first thin film transistor $T_r$) and one of the first end S and the second end D of the second thin film transistor $T_{d1}$, the second thin film transistor $T_{d2}$, the second thin film transistor $T_{d3}$, or the second thin film transistor $T_{d4}$ are electrically coupled to a node (not shown). The first thin film transistor $T_r$ may reset the voltage of the node according to the reset signal, so as to reset a light emitting status of the first opening region 170a, the second opening region 170b, the third opening region 170c, or the fourth opening region 170d.

Referring to FIG. 1, the conductive line 152 extends along a first direction x. The first opening region 170a and the second opening region 170b are arranged along the first direction x. The third opening region 170c and the first opening region 170a are adjacent to each other ("adjacent" is defined as that no other opening region exists on the shortest connection line between two opening regions), and the third opening region 170c and the second opening region 170b are adjacent to each other. The area of the first opening region 170a is less than the area of the third opening region 170c. The area of the second opening region 170b is less than the area of the third opening region 170c. As shown in FIG. 2, the area of the first opening region 170a, the area of the second opening region 170b, and the area of the third opening region 170c respectively refer to the area of a bottom portion 173 of the first opening region 170a, the area of a bottom portion 173 of the second opening region 170b, and the area of a bottom portion 173 of the third opening region 170c. The conductive line 152 is located between the first opening region 170a and the third opening region 170c. The conductive line 152 is electrically coupled to the first thin film transistor $T_r$ via the first contact hole 142, and the first contact hole 142 is located between the first opening region 170a and the second opening region 170b. In this embodiment, the first opening region 170a and the second opening region 170b are arranged along the first direction x to form a first row, and the fourth opening region 170d and the third opening region 170c are arranged along the first direction x to form a second row. The first row may be adjacent to the second row. The second opening region 170b is adjacent to the third opening region 170c, and the second opening region 170b is adjacent to the fourth opening region 170d. The area of the fourth opening region 170d may be larger than the area of the first opening region 170a and the area of the second opening region 170b and less than the area of the third opening region 170c. In this embodiment, the conductive line 152 may also be located between the second opening region 170b and the third opening region 170c, between the second opening region 170b and the fourth opening region 170d, and between the first opening region 170a and the fourth opening region 170d. In a word, the conductive line 152 is a bent line that bypasses the first opening region 170a, the second opening region 170b, the third opening region 170c, and the fourth opening region 170d, but the disclosure is not limited thereto. In this embodiment, the light from the first opening region 170a (e.g., the light emitted by the organic electroluminescent pattern 161) may have the same color as the light from the second opening region 170b (e.g., the light emitted by the organic electroluminescent pattern 162), and the light from the first opening region 170a may have a different color from the light from the third opening region 170c (e.g., the light emitted by the organic electroluminescent pattern 163). The light from the fourth opening region 170d (e.g., the light emitted by the organic electroluminescent pattern 164) may have a different color from the light from the third opening region 170c. For example, the color of the light from the first opening region 170a, the color of the light from the second opening region 170b, the color of the light from the third opening region 170c, and the color of the light from the fourth opening region 170d may be green, green, blue, and red respectively, but the disclosure is not limited thereto.

It should be noted that the first contact hole 142 and the first opening region 170a are separated by a first distance D1. The first distance D1 is the shortest distance between the first contact hole 142 and the first opening region 170a. More specifically, the first distance D1 refers to the shortest distance between a vertical projection of a bottom portion 174 of the first contact hole 142 on the substrate 110 and a vertical projection of the bottom portion 173 of the first opening region 170a on the substrate 110. The first contact hole 142 and the second opening region 170b are separated by a second distance D2. More specifically, the second distance D2 refers to the shortest distance between the vertical projection of the bottom portion 174 of the first contact hole 142 on the substrate 110 and a vertical projection of the bottom portion 173 of second opening region 170b on the substrate 110. The second distance D2 is the shortest distance between the first contact hole 142 and the second opening region 170b. In particular, the first distance D1 is different from the second distance D2. In this embodiment, the second distance D2 may be larger than the first distance D1, but the disclosure is not limited thereto. It should be noted that, with the layout design that makes the first distance D1 be different from the second distance D2, the first opening region 170a, the second opening region 170b, and the third opening region 170c are arranged close to one another, so as to improve the resolution of the display device 100.

Figure 3:
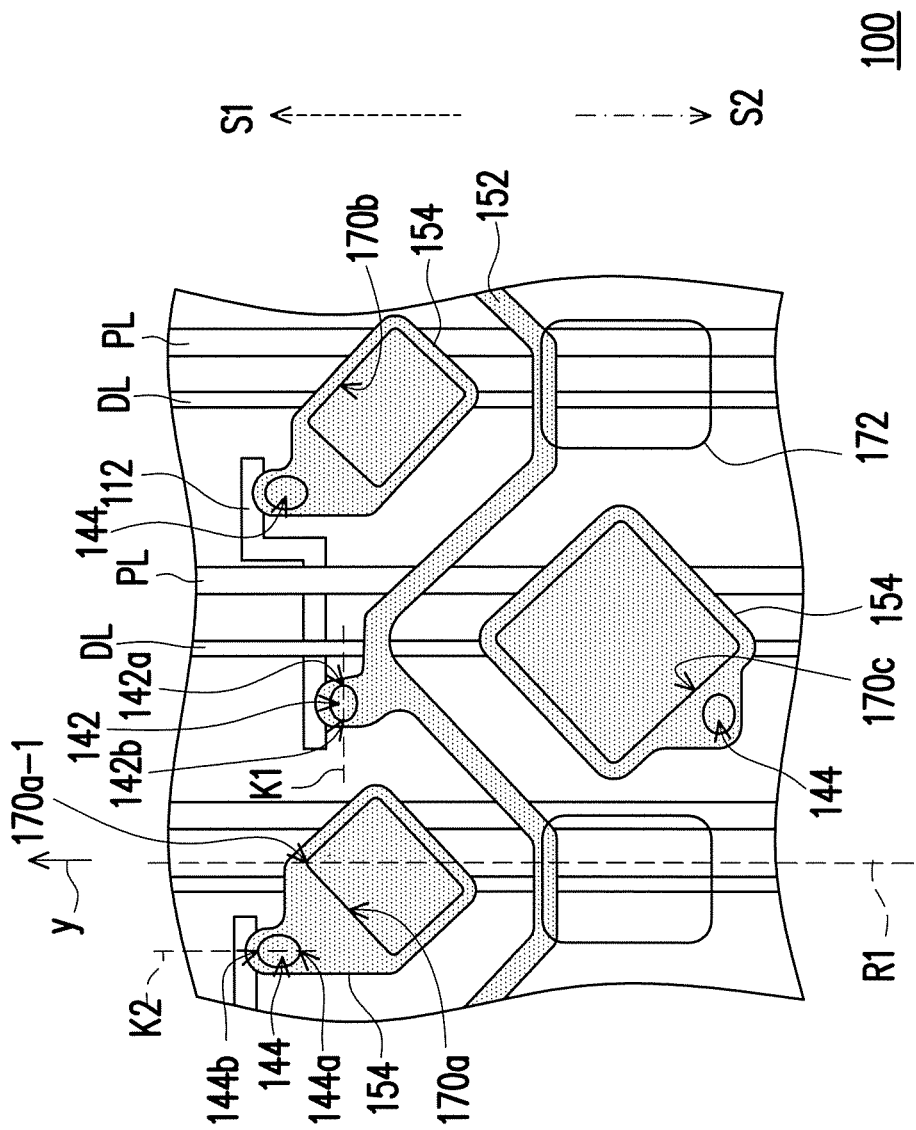
FIG. 3 is a schematic enlarged view of a part of the display device of FIG. 1.

FIG. 3 is a schematic enlarged view of a part of the display device of FIG. 1. Referring to FIG. 3, a second direction y is parallel to a bearing surface 110a (as shown in FIG. 2) of the substrate 110. In other words, the second direction y is perpendicular to a normal direction of the bearing surface 110a of the substrate 110, and the second direction y is perpendicular to the first direction x. The first opening region 170a has an end point 170a-1 that is farthest away from the conductive line 152 in the second direction y. A virtual line R1 that passes through the end point 170a-1 is defined along the second direction y. In this embodiment, the first contact hole 142 and the second contact hole 144 corresponding to the first opening region 170a are located on different sides of the virtual line R1. Thus, the first opening region 170a, the second opening region 170b, and the third opening region 170c are arranged closer to one another, so as to further improve the resolution of the display device 100.

Figure 4:
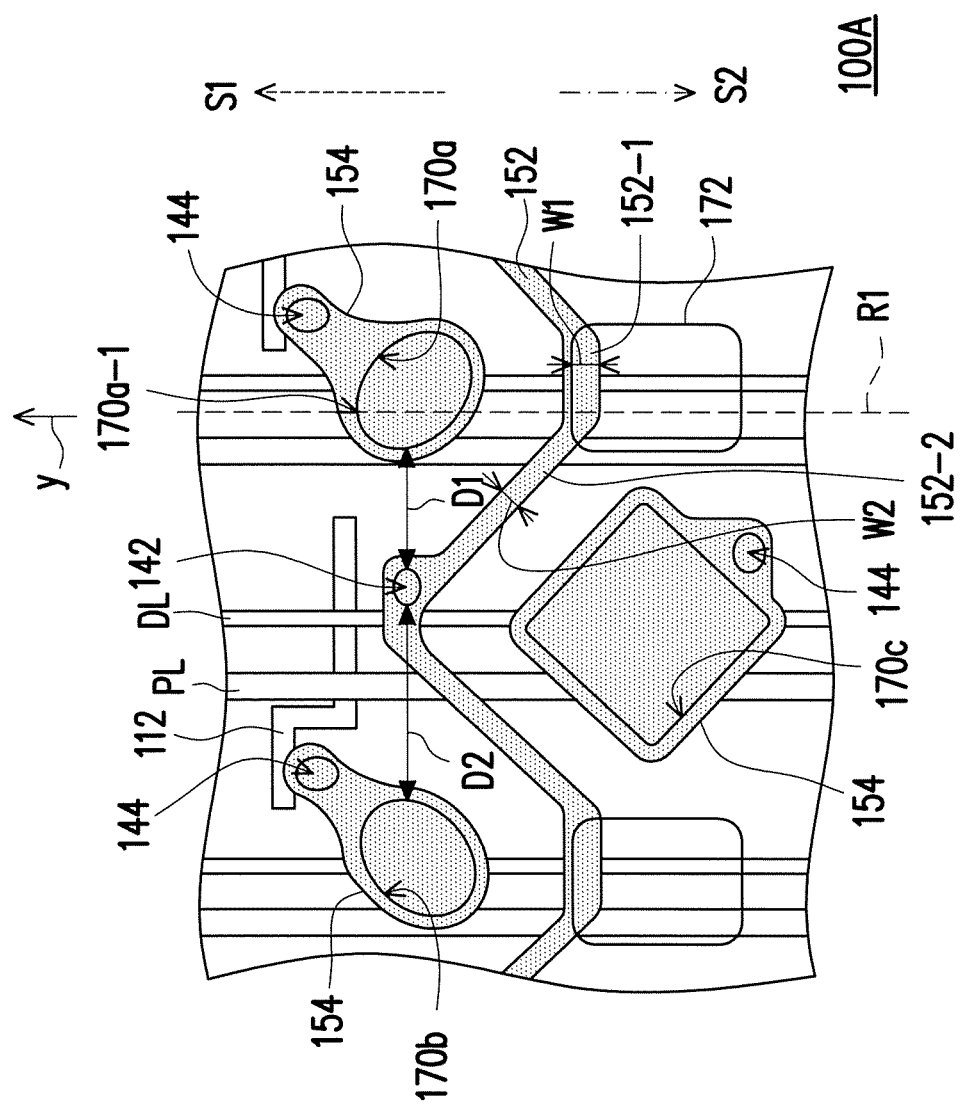
FIG. 4 is a schematic enlarged view of a part of the display device according to another embodiment of the disclosure.

Referring to FIG. 3, in this embodiment, the first opening region 170a may have a polygonal shape, and the end point 170a-1 may be a vertex of the polygonal shape. However, the disclosure is not limited thereto. In other embodiments, the first opening region 170a may have an oval shape, a circular shape, or other non-polygonal shapes, and the end point 170a-1 may be a point that is farthest away from the conductive line 152 on the oval shape, the circular shape, or other non-polygonal shapes, and is not necessarily the vertex of the polygonal shape. The following is described with reference to FIG. 4. FIG. 4 is a schematic enlarged view of a part of the display device according to another embodiment of the disclosure. Referring to FIG. 4, the first opening region 170a has the end point 170a-1 that is farthest away from the conductive line 152 in the second direction y. The virtual line R1 that passes through the end point 170a-1 is defined along the second direction y, and the first contact hole 142 and the second contact hole 144 corresponding to the first opening region 170a are located on different sides of the virtual line R1. Unlike the display device 100, in the display device 100A, the first opening region 170a and the second opening region 170b may have oval shapes. The first opening region 170a has the end point 170a-1 that is farthest away from the conductive line 152 thereon, and the end point 170a-1 may not fall on a long axis or a short axis of the oval shape, but the disclosure is not limited thereto. Moreover, in the embodiment of FIG. 4, the conductive line 152 may have inconsistent line widths. For example, the conductive line 152 has a first portion 152-1 and a second portion 152-1, a line width W1 of the first portion 152-1 is greater than a line width W2 of the second portion 152-2, and the spacer 172 overlaps with the first portion 152-1, but the disclosure is not limited thereto.

Referring to FIG. 3, in this embodiment, the first contact hole 142 has a first contour. The first contour of the first contact hole 142 has a first point 142a and a second point 142b that are farthest away from each other. The first point 142a and the second point 142b define a virtual first extension line K1. The first point 142a may be closer to the corresponding data line DL than the second point 142b, but the disclosure is not limited thereto. The second contact hole 144 has a second contour. The second contour of the second contact hole 144 has a third point 144a and a fourth point 144b that are farthest away from each other. The third point 144a and the fourth point 144b define a virtual second extension line K2. The third point 144a may be closer to the conductive line 152 than the fourth point 144b, but the disclosure is not limited thereto. It should be noted that the extension direction of the first extension line K1 is different from the extension direction of the second extension line K2. For example, the extension direction of the first extension line K1 may be perpendicular to the extension direction of the second extension line K2. In other embodiments, an angle may be formed between the extension direction of the first extension line K1 and the extension direction of the second extension line K2, but the disclosure is not limited thereto. In this embodiment, the first contour of the first contact hole 142 has a first oval shape, and the first point 142a and the second point 142b that are farthest away from each other on the first contour may be located at two ends of the long axis of the first oval shape. The second contour of the second contact hole 144 has a second oval shape, and the third point 144a and the fourth point 144b that are farthest away from each other on the second contour may be located at two ends of the long axis of the second oval shape. The long axis of the first oval shape may not be parallel to the long axis of the second oval shape. Nevertheless, the disclosure is not limited thereto. In other embodiments, the long axis of the first oval shape may be parallel to the long axis of the second oval shape. The following is described with reference to FIG. 5.

Figure 5:
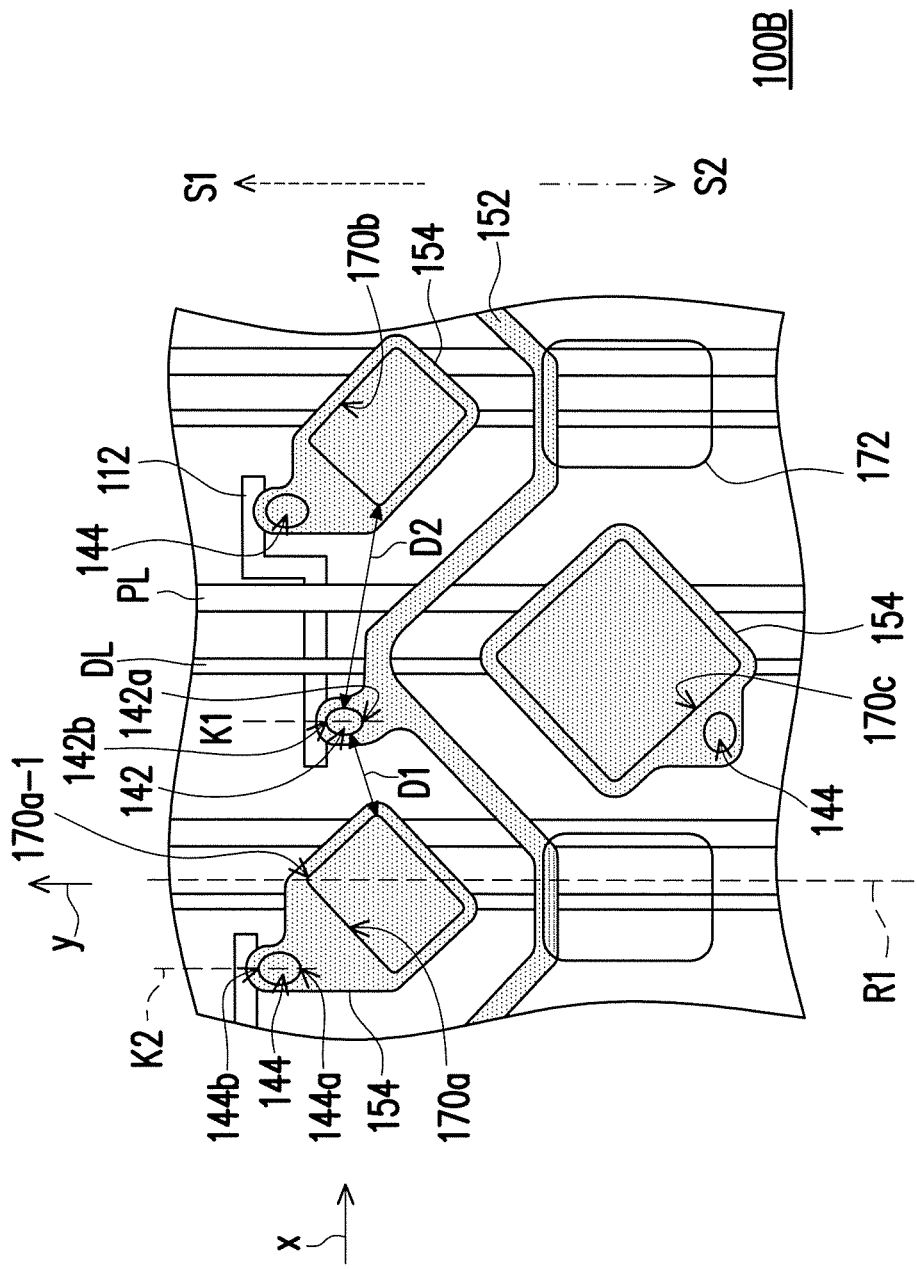
FIG. 5 is a schematic enlarged view of a part of the display device according to yet another embodiment of the disclosure.

FIG. 5 is a schematic enlarged view of a part of the display device according to yet another embodiment of the disclosure. Referring to FIG. 5, the first contact hole 142 has a first contour. The first contour of the first contact hole 142 has the first point 142a and the second point 142b that are farthest away from each other. The first point 142a may be closer to the third opening region 170c than the second point 142b, but the disclosure is not limited thereto. The first point 142a and the second point 142b define the first extension line K1. The second contact hole 144 has a second contour. The second contour of the second contact hole 144 has the third point 144a and the fourth point 144b that are farthest away from each other. The third point 144a may be closer to the conductive line 152 than the fourth point 144b, but the disclosure is not limited thereto. The third point 144a and the fourth point 144b define the second extension line K2. The extension direction of the first extension line K1 may be parallel to the extension direction of the second extension line K2. More specifically, the first contour of the first contact hole 142 has a first oval shape, and the first point 142a and the second point 142b that are farthest away from each other on the first contour may be located at two ends of the long axis of the first oval shape. The second contour of the second contact hole 144 has a second oval shape, and the third point 144a and the fourth point 144b that are farthest away from each other on the second contour may be located at two ends of the long axis of the second oval shape. Unlike the display device 100, in the embodiment of the display device 100B, the long axis of the first oval shape and the long axis of the second oval shape may be parallel to each other. In other embodiments, an angle may be formed between the long axis of the first oval shape and the long axis of the second oval shape, but the disclosure is not limited thereto.

It should be noted that, although the first contour of the first contact hole 142 and the second contour of the second contact hole 144 have the oval shapes in the above example, the disclosure is not limited thereto. In other embodiments, the first contour of the first contact hole 142 and the second contour of the second contact hole 144 may have other suitable shapes. In addition, in other embodiments, the shape of the first contour of the first contact hole 142 and the shape of the second contour of the second contact hole 144 may not be necessarily the same or similar.

Referring to FIG. 1 and FIG. 2, in this embodiment, the display device 100 further includes the spacer 172. The spacer 172 is disposed on the substrate 110. More specifically, the spacer 172 is disposed among the second opening region 170b, the third opening region 170c, and the fourth opening region 170d. The spacer 172 may partially overlap the conductive line 152. In other words, the spacer 172 and the portion of the conductive line 152 may use the same area in the direction perpendicular to the substrate 110 (in the top view) to save the area of the substrate 110 to be used by the first opening region 170a, the second opening region 170b, the third opening region 170c, and/or the fourth opening region 170d or other components, so as to improve the resolution and/or brightness of the display device 100. In this embodiment, the spacer 172 and the pixel define layer 170 may be formed in the same layer, and the material of the spacer 172 may be the same as the material of the pixel define layer 170. In a word, the spacer 172 may be a protrusion portion of the pixel define layer 170. Nevertheless, the disclosure is not limited thereto. In other embodiments, the spacer 172 and the pixel define layer 170 may be formed in different layers, and the material of the spacer 172 is not necessarily the same as the material of the pixel define layer 170. In other embodiments, the spacer 172 may be disposed among the first opening region 170a, the third opening region 170c, and other fourth opening region 170d not shown here, but the disclosure is not limited thereto.

Figure 6:
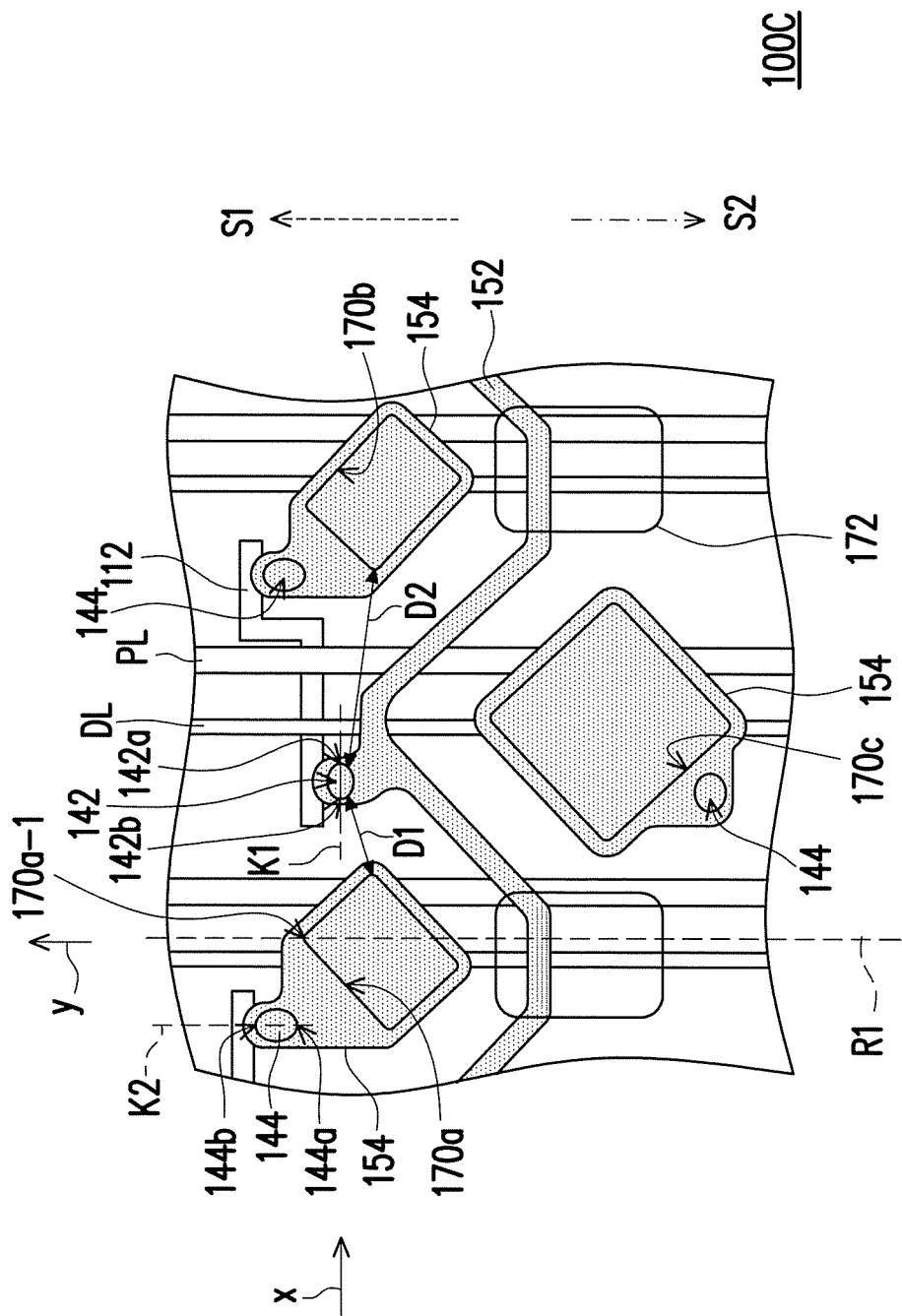
FIG. 6 is a schematic top view of the display device according to yet another embodiment of the disclosure.
Figure 8:
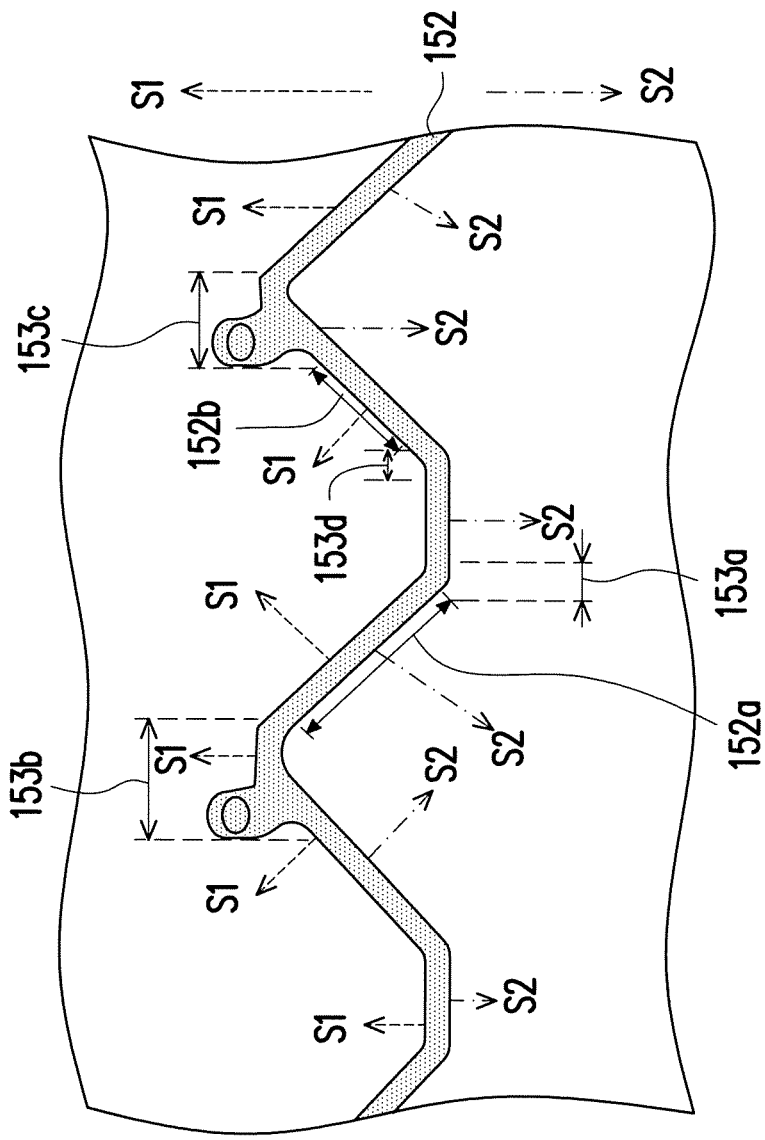
FIG. 8 illustrates the first side and the second side of the conductive line of FIG. 1.

FIG. 8 illustrates a first side S1 and a second side S2 of the conductive line 152 of FIG. 1. Referring to FIG. 1, FIG. 2, and FIG. 8, in this embodiment, an orthographic projection of the first opening region 170a on the insulating layer 140 and an orthographic projection of the second opening region 170b on the insulating layer 140 are located on the first side S1 of an orthographic projection of the conductive line 152 on the insulating layer 140 (e.g., an upper region of the conductive line 152 in FIG. 8). An orthographic projection of the third opening region 170c on the insulating layer 140 and an orthographic projection of the fourth opening region 170d on the insulating layer 140 are located on the second side S2 of the orthographic projection of the conductive line 152 on the insulating layer 140 (e.g., a lower region of the conductive line 152 in FIG. 8). The orthographic projection of the spacer 172 on the insulating layer 140 may partially overlap the orthographic projection of the conductive line 152 on the insulating layer 140. The orthographic projection of a portion of the spacer 172 on the insulating layer 140 may be located on the second side S2 of the orthographic projection of the conductive line 152 on the insulating layer 140, and the orthographic projection of the spacer 172 on the insulating layer 140 does not overlap the first side S1 of the orthographic projection of the conductive line 152 on the insulating layer 140. In a word, the orthographic projection of the first opening region 170a on the insulating layer 140 and the orthographic projection of the second opening region 170b on the insulating layer 140 are located on the same side (e.g., the first side S1) of the orthographic projection of the conductive line 152 on the insulating layer 140, and the orthographic projection of the spacer 172 on the insulating layer 140 does not be disposed across the conductive line 152. Nevertheless, the disclosure is not limited to the above. FIG. 6 is a schematic top view of the display device according to yet another embodiment of the disclosure. Referring to FIG. 6, unlike the display device 100, in the embodiment of the display device 100C, the orthographic projection of the spacer 172 on the insulating layer 140 may be disposed across the conductive line 152 to partially overlap the first side S1 and the second side S2 of the orthographic projection of the conductive line 152 on the insulating layer 140.

Figure 7:
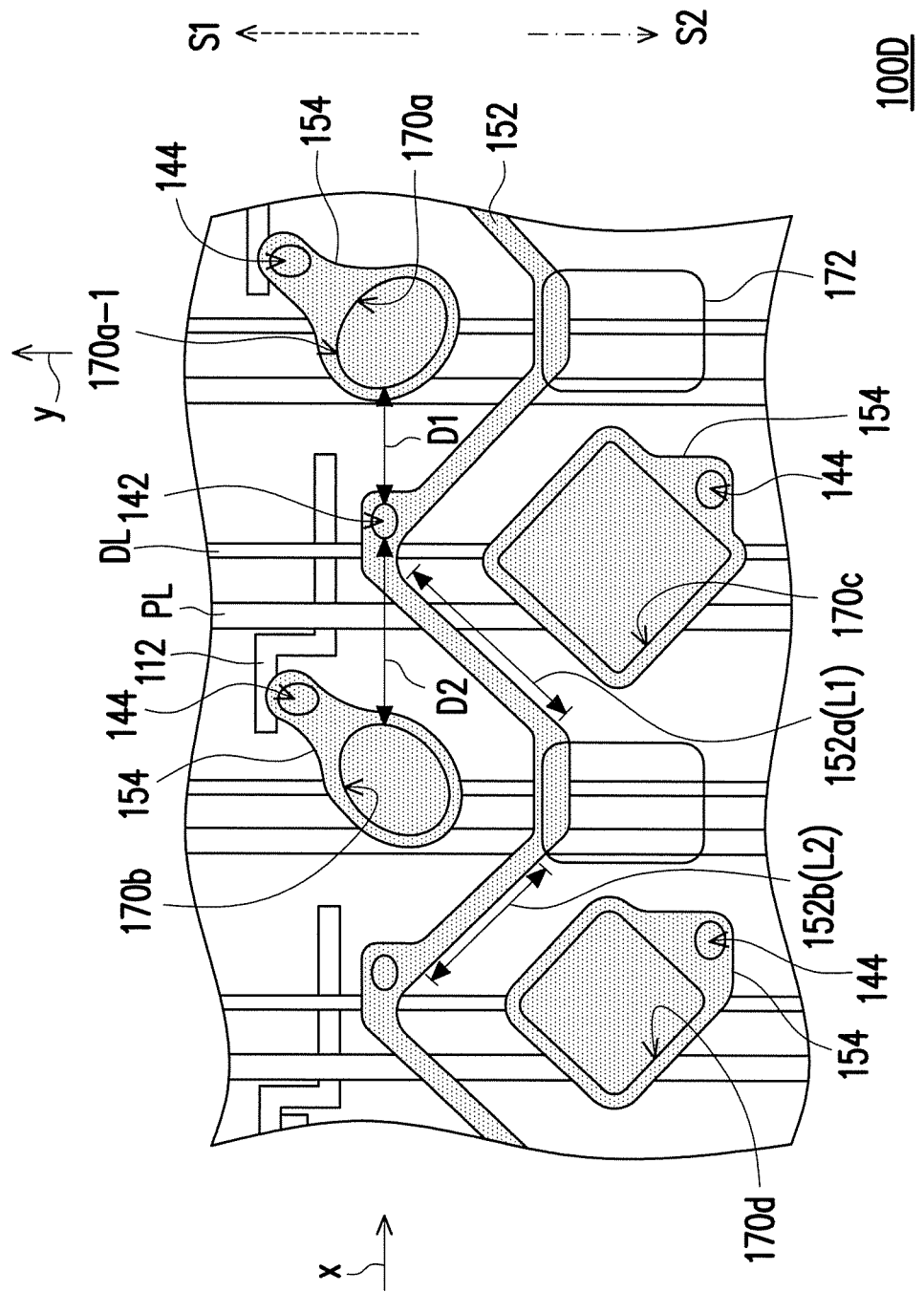
FIG. 7 is a schematic top view of the display device according to an embodiment of the disclosure.

Referring to FIG. 1 and FIG. 2, in this embodiment, the conductive line 152 may include a first straight portion 152a, which is located between the second opening region 170b and the third opening region 170c, and a second straight portion 152b, which is located between the second opening region 170b and the fourth opening region 170d. More specifically, the conductive line 152 may be a bent line, as shown in FIG. 8, wherein the first straight portion 152a refers to the first straight portion located between adjacent two bending portions 153a and 153b, and the first straight portion is located between the second opening portion 170b and the third opening portion 170c; and the second straight portion 152b refers to the second straight portion located between adjacent two bending portions 153d and 153c, and the second straight portion is located between the second opening region 170b and the fourth opening region 170d. An extension direction of the first straight portion 152a is different from an extension direction of the second straight portion 152b, but is not limited thereto. In particular, a length L1 of the first straight portion 152a may be different from a length L2 of the second straight portion 152b, but the disclosure is not limited thereto. Referring to FIG. 1 and FIG. 8, the conductive line 152 comprises a first straight portion 152a and a second straight portion 152b, the first straight portion 152a is located between the second opening region 170b and the third opening region 170c, the second straight portion 152b is located between the second opening region 170b and the fourth opening region 170d, and a length L1 of the first straight portion 152a is different from a length L2 of the second straight portion 152b. The first straight portion 152a is located between adjacent two bending portions 153a, 153b, and the spacer 172 and one of the two bending portions 153a, 153b (i.e. the bending portions 153a) are overlapped. FIG. 7 is a schematic top view of the display device according to an embodiment of the disclosure. Referring to FIG. 7, in the embodiment of the display device 100D, the length L1 of the first straight portion 152a and the length L2 of the second straight portion 152b are not the same. Unlike the display device 100, in the embodiment of the display device 100D, the first opening region 170a and the second opening region 170b may have oval shapes.

To sum up, the display device disclosed in the embodiments of the disclosure includes the first thin film transistor disposed on the substrate, the insulating layer disposed on the first thin film transistor, the conductive line, and the pixel define layer. The conductive line is disposed on the insulating layer and is electrically coupled to the first thin film transistor via the first contact hole of the insulating layer. The pixel define layer is disposed on the insulating layer. The pixel define layer has the first opening region, the second opening region, and the third opening region. The conductive line extends along the first direction. The first opening region and the second opening region are arranged along the first direction. The third opening region is adjacent to the first opening region and the second opening region. The area of the first opening region is less than the area of the third opening region. The area of the second opening region is less than the area of the third opening region. The conductive line is located between the first opening region and the third opening region, and the first contact hole is located between the first opening region and the second opening region. The first contact hole and the first opening region are separated by the first distance. The first distance is the shortest distance between the first contact hole and the first opening region. The first contact hole and the second opening region are separated by the second distance. The second distance is the shortest distance between the first contact hole and the second opening region, and the first distance is different from the second distance. With the layout design that makes the first distance be different from the second distance, the first opening region, the second opening region, and the third opening region are arranged close to one another, so as to improve the resolution of the display device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
   a substrate;
   a first thin film transistor disposed on the substrate;
   an insulating layer disposed on the first thin film transistor and having a first contact hole;
   a conductive line disposed on the insulating layer, wherein the conductive line is electrically coupled to the first thin film transistor via the first contact hole, and the conductive line extends along a first direction; and
   a pixel define layer disposed on the insulating layer, wherein the pixel define layer comprises a first opening region, a second opening region, and a third opening region, wherein the first opening region and the second opening region are arranged along the first direction, the third opening region is adjacent to the first opening region, and the third opening region is adjacent to the second opening region,
   wherein the conductive line is located between the first opening region and the third opening region, and the first contact hole is located between the first opening region and the second opening region, and
   an area of the first opening region is less than an area of the third opening region, an area of the second opening region is less than the area of the third opening region, the first contact hole and the first opening region are separated by a first distance, the first contact hole and the second opening region are separated by a second distance, and the first distance is different from the second distance.

2. The display device according to claim 1, further comprising:
   an electrode partially overlapping the first opening region.

3. The display device according to claim 2, further comprising:
   a power line disposed on the substrate; and
   a second thin film transistor, wherein a first end of the second thin film transistor is electrically coupled to the power line, and a second end of the second thin film transistor is electrically coupled to the electrode.

4. The display device according to claim 3, wherein one of a first end and a second end of the first thin film transistor is electrically coupled to a gate of the second thin film transistor.

5. The display device according to claim 2, further comprising:
   a second thin film transistor disposed on the substrate, wherein the insulating layer is disposed on the second thin film transistor, the electrode is disposed on the insulating layer, the insulating layer further has a second contact hole, and the electrode is electrically coupled to the second thin film transistor via the second contact hole.

6. The display device according to claim 5, wherein a second direction is parallel to the substrate and perpendicular to the first direction, the first opening region comprises an end point that is farthest away from the conductive line in the second direction, a virtual line passing through the end point is defined along the second direction, and the first contact hole and the second contact hole are located on two different sides of the virtual line.

7. The display device according to claim 5, wherein the first contact hole has a first contour, the first contour comprises a first point and a second point that are farthest away from each other, and the first point and the second point define a first extension line, wherein the second contact hole has a second contour, the second contour comprises a third point and a fourth point that are farthest away from each other, and the third point and the fourth point define a second extension line, wherein an extension direction of the first extension line is different from an extension direction of the second extension line.

8. The display device according to claim 5, wherein the first contact hole has a first contour, the first contour comprises a first point and a second point that are farthest away from each other, and the first point and the second point define a first extension line, wherein the second contact hole has a second contour, the second contour comprises a third point and a fourth point that are farthest away from each other, and the third point and the fourth point define a second extension line, wherein an extension direction of the first extension line is parallel to an extension direction of the second extension line.

9. The display device according to claim 1, further comprising:
   a spacer disposed on the substrate,
   wherein the pixel define layer further comprises a fourth opening region, and the spacer is disposed among the second opening region, the third opening region, and the fourth opening region.

10. The display device according to claim 9, wherein the spacer partially overlaps the conductive line.

11. The display device according to claim 9, wherein the conductive line has a first portion and a second portion, a line width of the first portion is greater than a line width of the second portion, and the spacer overlaps with the first portion.

12. The display device according to claim 9, wherein a material of the spacer is the same as a material of the pixel define layer.

13. The display device according to claim 1, wherein the pixel define layer further comprises a fourth opening region, the second opening region is adjacent to the third opening region and the fourth opening region, and an area of the fourth opening region is larger than the area of the second opening region and less than the area of the third opening region.

14. The display device according to claim 13, wherein the conductive line is located between the second opening region and the fourth opening region.

15. The display device according to claim 13, wherein the conductive line is located between the second opening region and the third opening region, and the conductive line is located between the second opening region and the fourth opening region, wherein the conductive line comprises a first straight portion and a second straight portion, the first straight portion is located between the second opening region and the third opening region, the second straight portion is located between the second opening region and the fourth opening region, and a length of the first straight portion is different from a length of the second straight portion.

16. The display device according to claim 15, wherein an extension direction of the first straight portion is different from an extension direction of the second straight portion.

17. The display device according to claim 15, wherein the first straight portion is located between adjacent two bending portions.

18. The display device according to claim 17, further comprising a spacer, wherein the spacer and one of the two bending portions are overlapped.

19. The display device according to claim 13, wherein a color of a light from the first opening region is the same as a color of a light from the second opening region, the color of the light from the first opening region is different from a color of a light from the third opening region, and a color of a light from the fourth opening region is different from the color of the light from the third opening region.

20. The display device according to claim 1, further comprising:
   a data line disposed on the substrate, wherein the first contact hole has a first contour, the first contour has a first point and a second point, the first point and the second point are farthest away from each other, the first point and the second point define a virtual first extension line, and an extension direction of the first extension line is different from an extension direction of the data line.

* * * * *